US008305796B2

(12) United States Patent  
Chevallier et al.

(10) Patent No.: US 8,305,796 B2  
(45) Date of Patent: Nov. 6, 2012

(54) ACCESS SIGNAL ADJUSTMENT CIRCUITS AND METHODS FOR MEMORY CELLS IN A CROSS-POINT ARRAY

(75) Inventors: Christophe Chevallier, Palo Alto, CA (US); Chang Hua Siau, Saratoga, CA (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 0 days.

(21) Appl. No.: 13/425,247

(22) Filed: Mar. 20, 2012

(65) Prior Publication Data

US 2012/0176832 A1 Jul. 12, 2012

Related U.S. Application Data

(62) Division of application No. 12/657,895, filed on Jan. 29, 2010, now Pat. No. 8,139,409.

(51) Int. Cl.  
*G11C 11/00* (2006.01)

(52) U.S. Cl. .................................. 365/148; 365/189.09

(58) Field of Classification Search .................. 365/148, 365/189.09  
See application file for complete search history.

(56) References Cited

U.S. PATENT DOCUMENTS

| 8,139,396 | B2* | 3/2012 | Kurosawa et al. | 365/148 |
| 2009/0154232 | A1* | 6/2009 | Norman | 365/185.02 |
| 2010/0157647 | A1* | 6/2010 | Rinerson et al. | 365/51 |
| 2010/0157656 | A1* | 6/2010 | Tsuchida | 365/148 |
| 2011/0069533 | A1* | 3/2011 | Kurosawa et al. | 365/148 |

* cited by examiner

*Primary Examiner* — Tuan T. Nguyen  
(74) *Attorney, Agent, or Firm* — Stolowitz Ford Cowger LLP

(57) ABSTRACT

Embodiments of the invention relate generally to semiconductors and memory technology, and more particularly, to systems, integrated circuits, and methods to generate access signals to facilitate memory operations in scaled arrays of memory elements, such as memory implemented in third dimensional memory technology formed BEOL directly on top of a FEOL substrate that includes data access circuitry. In at least some embodiments, a non-volatile memory device can include a cross-point array having resistive memory elements disposed among word lines and subsets of bit lines, and an access signal generator. The access signal generator can be configured to modify a magnitude of a signal to generate a modified magnitude for the signal to access a resistive memory element associated with a word line and a subset of bit lines. The modified magnitude can be a function of the position of the resistive memory element in the cross-point array.

28 Claims, 10 Drawing Sheets

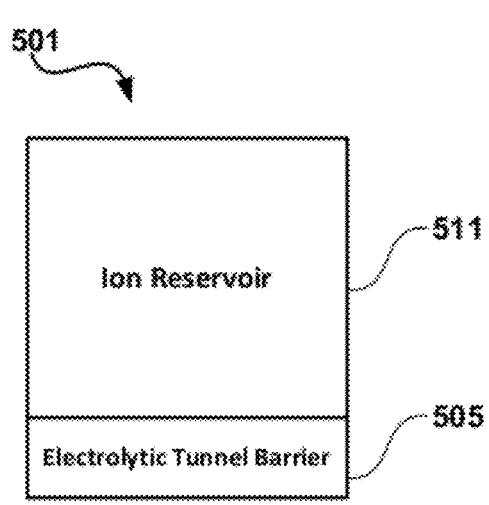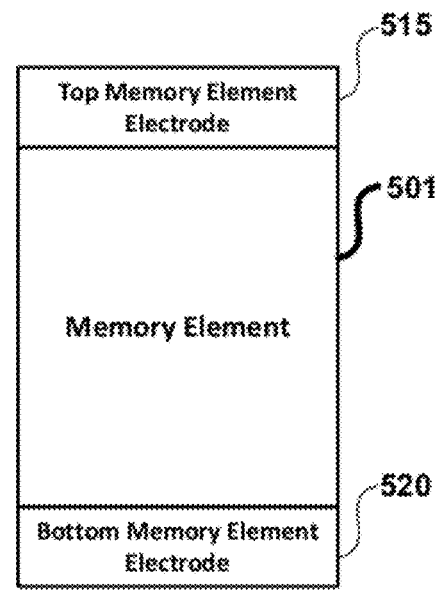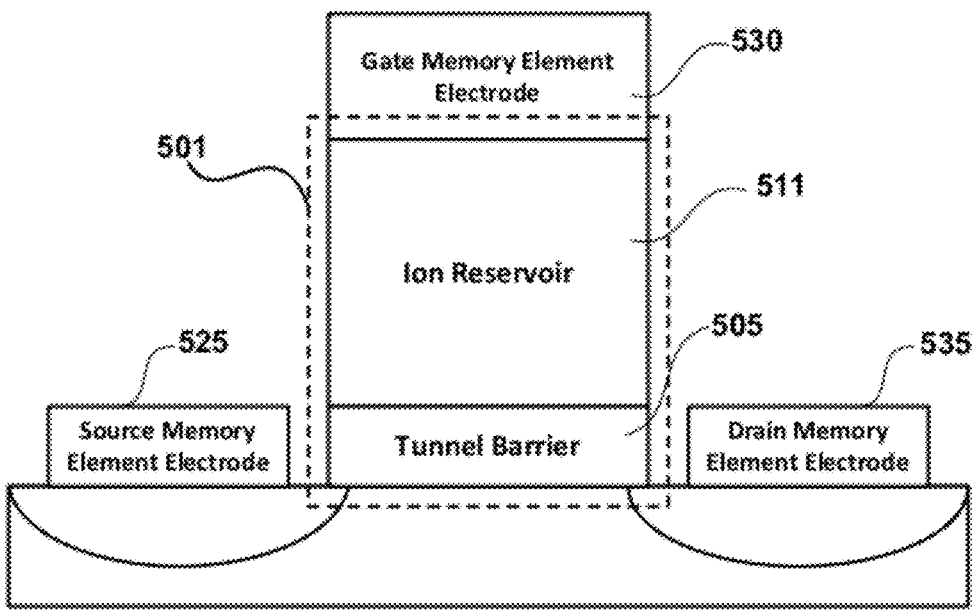
FIG. 5A
FIG. 5B
FIG. 5C

ACCESS SIGNAL ADJUSTMENT CIRCUITS AND METHODS FOR MEMORY CELLS IN A CROSS-POINT ARRAY

CROSS-REFERENCE TO RELATED APPLICATIONS

This application is related to U.S. patent application Ser. No. 11/095,026, filed Mar. 30, 2005, published as U.S. Pub. No. 2006/0171200, and entitled "Memory Using Mixed Valence Conductive Oxides," and with U.S. patent application Ser. No. 11/881,500, filed Sep. 11, 2008, published as U.S. Pub. No. 2009/002797, now issued U.S. Pat. No. 7,701,791, and entitled "Low Read Current Architecture for Memory," both of which are incorporated herein by reference for all purposes.

FIELD OF THE INVENTION

Embodiments of the invention relate generally to semiconductors and memory technology, and more particularly, to systems, integrated circuits, and methods to generate access signals to facilitate memory operations in scaled arrays of memory elements, such as implemented in third dimensional memory technology.

BACKGROUND

Scaling the dimensions of memory arrays and cells affect operational characteristics of memory technologies. In some memory technologies, a reduction in size of word lines or bit lines can increase the resistivity of those lines as the cross-sectional area of conductive paths is reduced also. The increased resistance of word lines or bit lines may produce a reduction of voltage (e.g., voltage drops) along those lines, for example, as a function of the amount of memory cells conducting current from the word lines or bit lines.

At least some conventional memory architectures, such as those including dynamic random access memory ("DRAM") cells and Flash memory cells, typically include gates as part of metal oxide semiconductor ("MOS") transistors or structures. The gates operate to open and close conductive paths between the word lines or bit lines and portions of the memory cells used as storage. When one of the conventional memory cells is unselected, its gate is in an "off" mode of operation and conducts negligible to no current. The gate structures used in conventional memory architectures buffer the conventional memory cells from the affects of increased resistance of word lines or bit lines. The above-described memory architectures, while functional for their specific technologies, are not well suited to address the scaling of memory array and cell dimensions for other memory technologies.

It would be desirable to provide improved systems, integrated circuits, and methods that minimize one or more of the drawbacks associated with conventional techniques for facilitating memory operations in scaled memory arrays and cells.

BRIEF DESCRIPTION OF THE DRAWINGS

The invention and its various embodiments are more fully appreciated in connection with the following detailed description taken in conjunction with the accompanying drawings, in which:

FIG. 5A depicts a block diagram representing the basic components of one embodiment of a memory element;

FIG. 5B depicts a block diagram of the memory element of FIG. 5A in a two-terminal memory cell;

FIG. 5C depicts a block diagram of the memory element of FIG. 5A in a three-terminal memory cell;

Like reference numerals refer to corresponding parts throughout the several views of the drawings. Note that most of the reference numerals include one or two left-most digits that generally identify the figure that first introduces that reference number.

DETAILED DESCRIPTION

Figure 1:
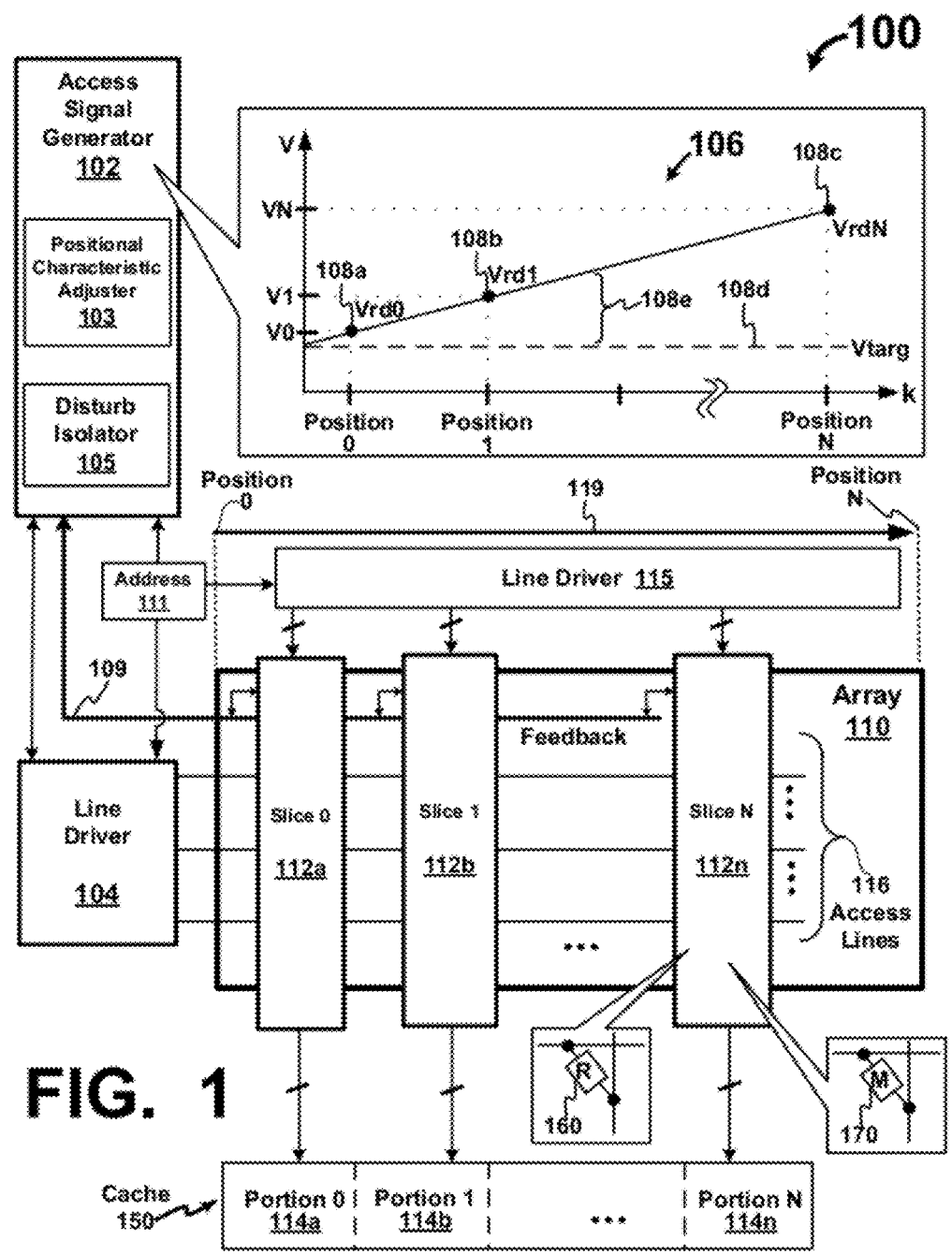
FIG. 1 depicts an access signal generator in accordance with various embodiments of the invention.

Various embodiments or examples of the invention may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

U.S. patent application Ser. No. 11/095,026, filed Mar. 30, 2005, published as U.S. Pub. No. 20060171200, and entitled "Memory Using Mixed Valence Conductive Oxides," is hereby incorporated by reference in its entirety for all purposes and describes non-volatile third dimensional memory elements that may be arranged in a two-terminal, cross-point memory array. New memory structures are possible with the capability of this third dimensional memory array. In at least some embodiments, a two-terminal memory element or memory cell can be configured to change conductivity when exposed to an appropriate voltage drop across the two-terminals. The memory element can include an electrolytic tunnel barrier and a mixed valence conductive oxide in some embodiments, as well as multiple mixed valence conductive oxide structures in other embodiments. A voltage drop across the electrolytic tunnel barrier can cause an electrical field within the mixed valence conductive oxide that is strong enough to move oxygen ions out of a mixed valence conductive oxide, according to some embodiments.

In some embodiments, an electrolytic tunnel barrier and one or more mixed valence conductive oxide structures (e.g., one or more layers of a conductive oxide material) do not need to operate in a silicon substrate, and, therefore, can be fabricated above circuitry being used for other purposes. That is, the active circuitry portion can be fabricated front-end-of-the-line (FEOL) on a substrate (e.g., a Silicon—Si wafer or other semiconductor substrate) and one or more layers of two-terminal cross-point memory arrays that include the non-volatile memory elements can be fabricated back-end-of-the-line (BEOL) directly on top of the substrate and electrically coupled with the active circuitry in the FEOL layer using an inter-level interconnect structure also fabricated FEOL. Further, a two-terminal memory element can be arranged as a cross-point such that one terminal is electrically coupled with an X-direction line (or an "X-line") and the other terminal is electrically coupled with a Y-direction line (or a "Y-line"). A third dimensional memory can include multiple memory elements vertically stacked upon one another, sometimes sharing X-direction and Y-direction lines in a layer of memory, and sometimes having isolated lines. When a first write voltage, VW1, is applied across the memory element (e.g., by applying ½ VW1 to the X-direction line and ½–VW1 to the Y-direction line), the memory element can switch to a low resistive state. When a second write voltage, VW2, is applied across the memory element (e.g., by applying ½ VW2 to the X-direction line and ½–VW2 to the Y-direction line), the memory element can switch to a high resistive state. Memory elements using electrolytic tunnel barriers and mixed valence conductive oxides can have VW1 opposite in polarity from VW2.

FIG. 5A shows an electrolytic tunnel barrier 505 and an ion reservoir 511, two basic components of the memory element 501. FIG. 5B shows the memory element 501 between a top memory electrode 515 and a bottom memory electrode 520. The orientation of the memory element (i.e., whether the electrolytic tunnel barrier 505 is near the top memory electrode 515 or the bottom memory electrode 520) may be important for processing considerations, including the necessity of seed layers and how the tunnel barrier reacts with the ion reservoir 511 during deposition. FIG. 5C shows the memory element 501 oriented with the electrolytic tunnel barrier 505 on the bottom in a three-terminal transistor device, having a source memory element electrode 525, gate memory element electrode 530 and a drain memory element electrode 535. In such an orientation, the electrolytic tunnel barrier 505 could also function as a gate oxide. Referring back to FIG. 5A, the electrolytic tunnel barrier 505 will typically be between 10 and less than 50 angstroms. If the electrolytic tunnel barrier 505 is much greater than 50 angstroms, then the voltage that is required to create the electric field necessary to move electrons through the memory element 501 via tunneling becomes too high for most electronic devices. Depending on the electrolytic tunnel barrier 505 material, a preferred electrolytic tunnel barrier 505 width might be between 15 and 40 angstroms for circuits where rapid access times (on the order of tens of nanoseconds, typically below 100 ns) in small dimension devices (on the order of hundreds of nanometers) are desired. Fundamentally, the electrolytic tunnel barrier 505 is an electronic insulator and an ionic electrolyte. As used herein, an electrolyte is any medium that provides an ion transport mechanism between positive and negative electrodes. Materials suitable for some embodiments include various metal oxides such as $Al_2O_3$, $Ta_2O_5$, $HfO_2$ and $ZrO_2$. Some oxides, such as zirconia might be partially or fully stabilized with other oxides, such as CaO, MgO, or $Y_2O_3$, or doped with materials such as scandium. The electrolytic tunnel barrier 505 will typically be of very high quality, being as uniform as possible to allow for predictability in the voltage required to obtain a current through the memory element 501. Although atomic layer deposition and plasma oxidation are examples of methods that can be used to create very high quality tunnel barriers, the parameters of a particular system will dictate its fabrication options. Although tunnel barriers can be obtained by allowing a reactive metal to simply come in contact with an ion reservoir 511, as described in PCT Patent Application No. PCT/US04/13836, filed May 3, 2004, already incorporated herein by reference, such barriers may be lacking in uniformity, which may be important in some embodiments. Accordingly, in a preferred embodiment of the invention the tunnel barrier does not significantly react with the ion reservoir 511 during fabrication. With standard designs, the electric field at the tunnel barrier 505 is typically high enough to promote tunneling at thicknesses between 10 and 50 angstroms. The electric field is typically higher than at other points in the memory element 501 because of the relatively high serial electronic resistance of the electrolytic tunnel barrier 505. The high electric field of the electrolytic tunnel barrier 505 also penetrates into the ion reservoir 511 at least one Debye length. The Debye length can be defined as the distance which a local electric field affects distribution of free charge carriers. At an appropriate polarity, the electric field within the ion reservoir 511 causes ions (which can be positively or negatively charged) to move from the ion reservoir 511 through the electrolytic tunnel barrier 505, which is an ionic electrolyte. The ion reservoir 511 is a material that is conductive enough to allow current to flow and has mobile ions. The ion reservoir 511 can be, for example, an oxygen reservoir with mobile oxygen ions. Oxygen ions are negative in charge, and will flow in the direction opposite of current. Each memory plug contains layers of materials that may be desirable for fabrication or functionality. For example, a non-ohmic characteristic that exhibit a very high resistance regime for a certain range of voltages ($V_{NO-}$ to $V_{NO+}$) and a very low resistance regime for voltages above and below that range might be desirable. In a cross point array, a non-ohmic characteristic could prevent leakage during reads and writes if half of both voltages were within the range of voltages $V_{NO-}$ to $V_{NO+}$. If each conductive array line carried ½ $V_W$, the current path would be the memory plug at the intersection of the two conductive array lines that each carried ½ $V_W$. The other memory plugs would exhibit such high resistances from the non-ohmic characteristic that current would not flow through the half-selected plugs.

FIG. 1 depicts an access signal generator in accordance with various embodiments of the invention. In this example, an access signal generator 102 is coupled to a line driver 104, which, in turn, is coupled via a number of access lines 116 to memory cells in an array 110. In some embodiments, array 110 is subdivided into slices 112, such as slice ("0") 112a, slice ("1") 112b, and slice ("N") 112n, each slice representing a group of memory cells. A cache 150, or equivalent memory structure, is shown to receive the data read from slices 112.

The data read into cache 150 (or any type of read buffer) can be in the form of a page or any other of unit of data. Access signal generator 102 is configured to modify a magnitude of signal to generate a modified magnitude to access a memory element in a memory cell associated with an access line 116 and one of slices 112, the modified magnitude being a function of the location of the memory element in array 110. In some embodiments, access signal generator 102 includes a positional characteristic adjuster 103 configured to determine the magnitude of the signal as a function of a distance 119 between the position of a memory element and access signal generator 102. In some embodiments, a memory element ("M") 170 is a resistive memory element configured to maintain a resistive state representative of a data stored therein. According to at least one embodiment, a reference element 160 can be disposed in a region local to memory element 170 to resolve the logical state of data stored in memory element 170. Optionally, access signal generator 102 can be configured to determine (e.g., modify) the magnitude based on an indicator signal via a feedback path 109, the indicator signal representing the magnitude of the signal at a location in array 110.

In view of the foregoing, the structures and/or functionalities of access signal generator 102 can provide for sufficient signal magnitudes to reliably access values (e.g., parametric values of resistances, currents, voltages, etc.) representing data stored in memory element 170 over various scaled dimensions of, for example, access lines 116, memory elements 170, slices 112, and/or array 110. In some embodiments, the various structures and/or functionalities of access signal generator 102 described herein can be configured to adjust the magnitude of the signal for accessing memory element 170 to compensate for one or more voltage drops associated with one or more other resistive memory elements. Therefore, access signal generator 102 can be configured to adjust the magnitude of the signal to compensate for a deviation in the magnitude from a target magnitude (e.g. such as a value for a target read voltage). To illustrate, consider that access signal generator 102 is configured to cause line driver 104 to generate a read voltage for accessing memory element 170 to read information stored therein, the read voltage being determined (e.g., being adjusted) based on the location of memory element 170 to compensate for one or more voltage drops over one of access lines 116 due to, for example, other unselected memory elements. In other memory operations, such as in a write operation or erase operation, line driver 104 and line driver 115 can individually or collectively determine (e.g., adjust) a write or erase voltage to compensate for the one or more voltage drops, according to some embodiments. An adjusted read voltage is configured to apply a target read voltage to a memory element 170 regardless of its position along access line 116. In various embodiments, a reference element 160 is disposed locally adjacent to memory element 170 (e.g., in slice 112n) and is configured to provide a reference signal based on the modified magnitude of an access signal. In various embodiments, the term "access signal" can refer to any type of signal (e.g., a voltage signal, a current signal, or any other signal) for accessing one or more memory cells in a memory operation, such as a read operation, a write operation, or an erase operation. The reference signal during read operations can be based on a position-dependent magnitude for a read voltage. In other memory operations, such as in a write operation or in an erase operation, the reference signal can be based on the position-dependent magnitude of a write voltage or an erase voltage, according to some embodiments. Also, a locally adjacent reference element 160 can enhance a sensing margin. Further, an indicator signal can be generated locally in a slice that includes the memory element to be accessed. For example, an indicator signal can be generated locally in slice 112n to access memory element 170, according to some embodiments. The indicator signal is configured to convey information representative of the magnitude of the access signal via one or more feedback paths 109 at a position of interest in array 110, such as at or near memory element 170. In read operations, a locally-generated indicator signal can be based on the position-dependent magnitude of the read voltage. In other memory operations, such as in a write operation or in an erase operation, the locally-generated indicator signal can be based on the position-dependent magnitude of a write voltage or an erase voltage, according to some embodiments.

To illustrate operation of access signal generator 102, consider the following example in which access signal generator 102 is configured to generate read voltage signals to read data from array 110, and the magnitude of the read voltages vary (e.g., increase) as a function of position 119 between position 0 and position N at which a memory element is accessed (e.g., for reading, writing, erasing, or for performing other memory-related operations). For an address 111, access signal generator 102 can identify one of access lines 116 and the associated memory elements to be access during a memory cell access operation, such as a read operation, a write operation, an erase operation, etc. Note that in some embodiments, the terms "position" and "distance" can be interchangeable. Positional characteristic adjuster 103 is configured to determine a magnitude of a read voltage as a characteristic of a signal as a function of position as depicted in relationship 106. For example, for positional characteristic adjuster 103 can modify the read voltage generated by line driver 104 to form a modified magnitude ("Vrd0") 108a so that at a first memory element, such as in slice 112a, the read voltage has a magnitude approximated to a target read voltage magnitude ("Vtarg") 108d. Thus, access signal generator 102 can generate modified magnitude ("Vrd0") 108a to compensate for a differential 108e (e.g., due to one or more voltage drops) along an access line 116 to apply a target magnitude 108d at or near the memory element being accessed. Similarly, positional characteristic adjuster 103 can modify the read voltages generated by line driver 104 to form modified magnitudes ("Vrd1") 108b and ("VrdN") 108c that are applied to one of access lines 116 so that the read voltages having magnitudes approximated to a target read voltage magnitude ("Vtarg") 108d can be applied on an access line 116 at or near a second memory element and a third memory element, respectively, disposed in slices 112b and 112n. In some embodiments, access signal generator 102 and line driver 104 cooperate to apply different modified magnitudes of an access signal to read different portions of read buffer. For example, as access signal generator 102 generates modified magnitudes 108a, 108b, and 108c for an access signal, the data can be read from slices 112a, 112b, and 112n into respective as portions 114a, 114b, and 114n of a read buffer, such as cache 150.

In at least one embodiment, access signal generator 102 includes a disturb isolator 105 configured to isolate or reduce the effects of phenomena that can cause a "disturb." The term disturb generally refers to the disturb effects, such as the electrical and/or electromagnetic coupling (or otherwise), on neighboring memory elements or cells not selected for accessing when other memory cells are accessed (e.g., for data operations on the accessed memory cell(s)). For example, application of read voltages to one of access lines 116 one or more times to read selected memory elements can affect or otherwise disturb the operability of unselected memory elements. Therefore, disturb isolator 105 can be configured to condition an access signal to access selected memory elements while isolating or reducing the disturb effects on unselected memory elements.

Memory element 170 can be selected by activating a line extending from line driver 115 and activating (e.g., applying a read voltage with a modified magnitude) one of access lines 116. In some embodiments, line driver 115 is configured as a Y-line driver and/or encoder to drive Y-lines (e.g., arranged in columns or bit lines) in a cross-point array, whereas line driver 104 is configured as an X-line driver and/or encoder to drive X-lines (e.g., arranged in rows or word lines). Note that in various embodiments, access signal generator 102 can be implemented in either X-lines or Y-lines, or both. Further, access signal generator 102 can be configured to generate modified magnitudes for access signals that are used to program or erase memory element 170, and, as such, can generate modified programming voltage magnitudes and/or modified erasing voltage magnitudes. In a specific implementation, a slice can include any number of Y-lines. For example, a slice can include 256 to 2,048 Y-lines, or more. In some embodiments, the structures and/or functionalities (or portions thereof) can be implemented in line driver 104 or line driver 115. Note that the terms "write", "program", and "erase" can be used interchangeably, according to some embodiments. For example, a write operation can comprise a programming operation or an erase operation on one or more memory elements and different magnitudes and polarities of a write voltage can be used to perform the program or erase operations.

Figure 2:
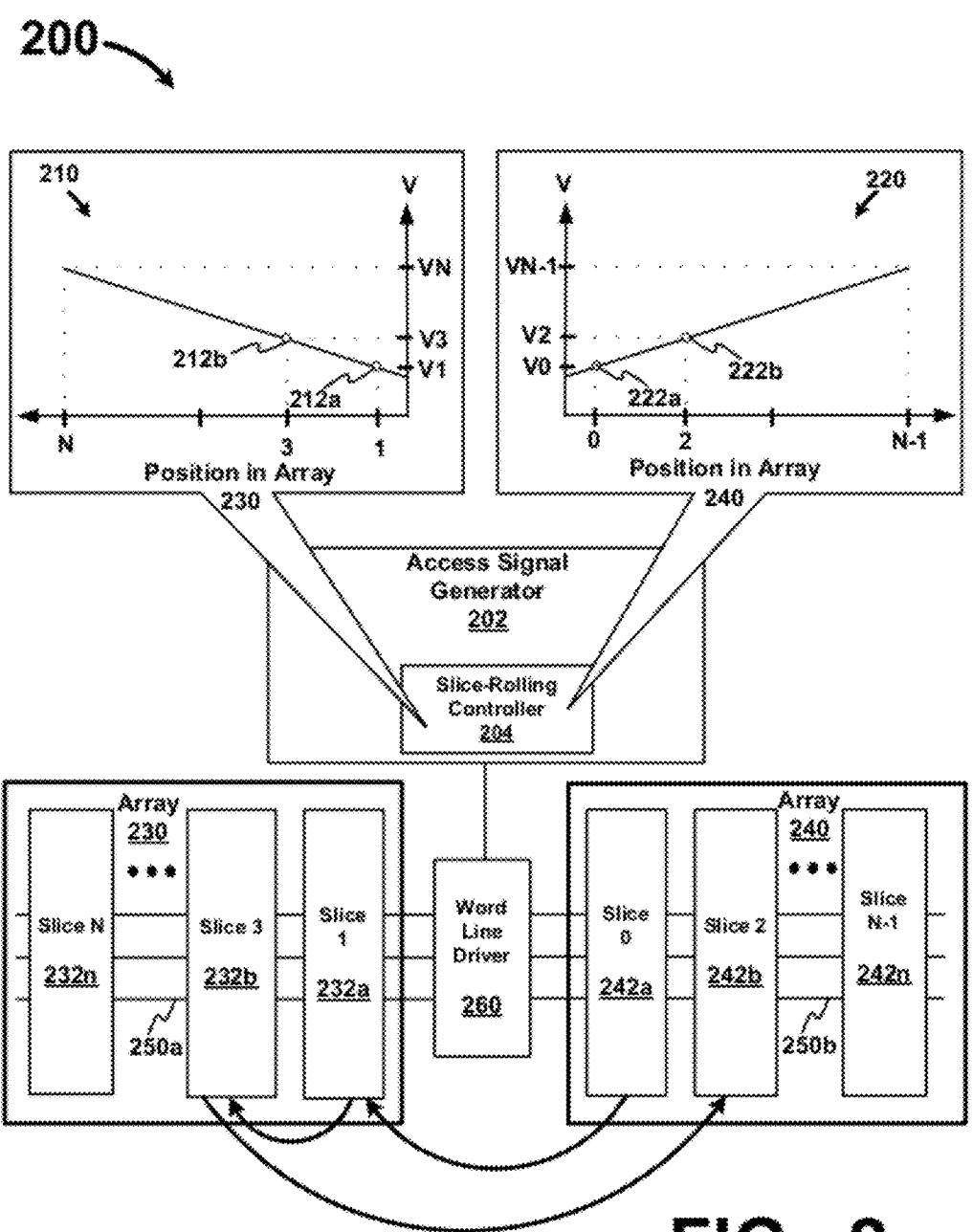
FIG. 2 depicts an access signal generator including a slice-rolling controller in accordance with various embodiments of the invention.

FIG. 2 depicts an access signal generator including a slice-rolling controller in accordance with various embodiments of the invention. As shown in diagram 200, an access signal generator 202 is configured to control a word line driver 260 to generate word line voltages with modified magnitudes, with word line driver 260 being disposed electrically between two different arrays, such as array 230 and array 240 (or between portions of arrays). Array 230 includes slice ("1") 232a, slice ("3") 232b, and slice ("N") 232N, whereas array 240 includes slice ("0") 242a, slice ("2") 242b, and slice ("N−1") 242n. In at least one embodiment, slice-rolling controller 204 is configured to "roll" thorough slices 232 and 242 to apply modified magnitudes of one or more access signals sequentially to the slices. For example, slice-rolling controller 204 can generate and apply a first modified magnitude of a read voltage to a group of memory elements associated with a group of bit lines (e.g., in slice 242a) during a first interval of time, and can apply a second modified magnitude of a read voltage to another group of memory elements associated with another group of bit lines (e.g., in slice 242b) during a second interval of time. Further, slice-rolling controller 204 can be configured to apply the same magnitude of an access signal to different positions in arrays 230 and 240, simultaneously or during different periods of time. In some examples, the different positions can be substantially equidistant from access signal generator 202. In a specific implementation, slice-rolling controller 204 can be configured further to increase the value of the modified magnitude as the distance increases between the different positions and access signal generator 202.

To illustrate, consider that slice-rolling controller 204 is configured to generate modified magnitudes as depicted in relationships 210 and 220. For example, slice-rolling controller 204 can be configured to generate magnitude ("V0") 222a for transmission to a memory element at a position "0" in slice 242a, and to generate magnitude ("V1") 212a for transmission to a memory element at a position "1" in slice 232a. Note that magnitudes 222a and 212a can be the same (or substantially the same). Subsequently, slice-rolling controller 204 can be configured to generate magnitude ("V2") 222b for transmission to a memory element at a position "2" in slice 242b, and to generate magnitude ("V3") 212b for transmission to a memory element at a position "3" in slice 232b. Note that magnitudes 222b and 212b can be the same (or substantially the same), and can be greater than magnitudes 222a and 212a. In one embodiment, slice-rolling controller 204 can be configured to apply magnitudes 212a and 222a to respective slices 232a and 242a simultaneously (e.g., to effect simultaneous reads of memory elements in slices 232a and 242a), with subsequent simultaneous application of magnitudes 212b and 222b to respective slices 232a and 242a. In another embodiment, slice-rolling controller 204 can be configured to apply magnitudes 212a and 222a to respective slices 232a and 242a at different intervals of time (e.g., to effect staggered reads of memory elements in slices 232a and 242a), such as depicted in diagram 200. As shown, slice-rolling controller 204 first applies a first modified magnitude to slice 242a during a first time interval, and then applies the first modified magnitude to slice 232a during a second time interval. Next, slice-rolling controller 204 then applies a second modified magnitude to slice 232b during a third time interval, and then applies the second modified magnitude to slice 242b during a fourth time interval. Slice-rolling controller 204 can operate in accordance with other schemes and is not limited to the above-described examples.

Figure 3:
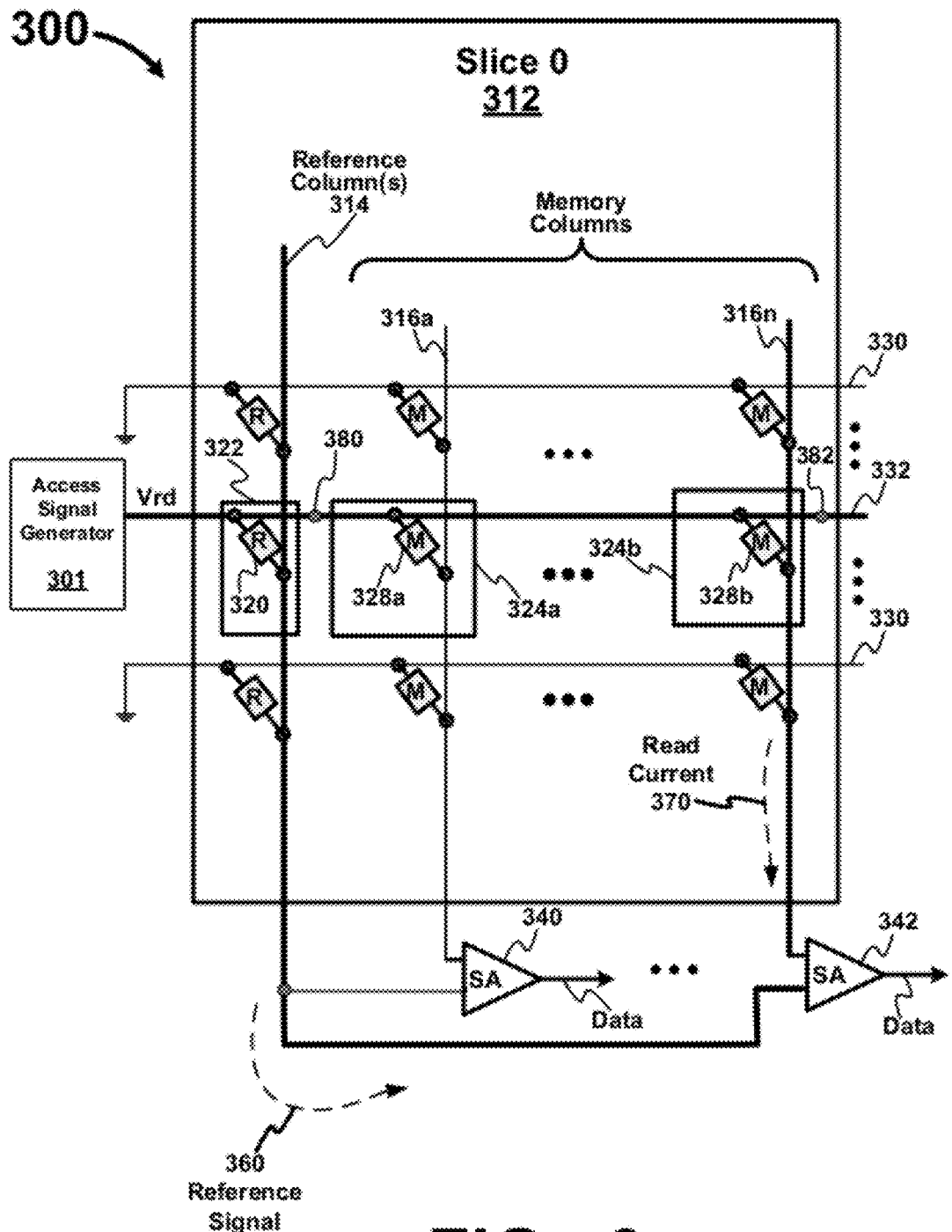
FIG. 3 is a diagram depicting an example of a structure for a slice in accordance with embodiments of the invention.

FIG. 3 depicts a diagram illustrating an example of a structure for a slice in accordance with embodiments of the invention. Diagram 300 depicts a slice ("0") 312 including a number of access lines 330 and 332 arranged in one orientation, and another number of access lines 314, 316a, and 316n arranged in another orientation (e.g., orthogonal to lines 330 and 332). Also shown, slice 312 is coupled to sensing circuitry, including sense amplifier ("SA") 340 and sense amplifier ("SA") 342. In some embodiments, access lines 330 and 332 are word lines, access line 314 is a reference bit line 314, and access lines 316a and 316n are bit lines arranged as memory columns (i.e., bit lines associated with memory elements to store information). Reference cells ("R") 322 are coupled at one side to reference bit line 314 and at another side to one of word lines 330 and 332. Memory cells ("M") 324 are coupled at one side to one of bit lines 316a to 316n and at another side to one of word lines 330 and 332.

Reference cell 322 include a reference memory element 320, which is formed to have the same (or approximately the same) structure and/functionality as a memory element 328 that constitutes the storage structure in memory cell 324. As reference memory element 320 is formed adjacent to memory elements 328a and 328b, they are more likely to be formed more similarly than if reference memory element 320 is formed external to either slice 312 or to an array. Reference memory element 320 is configured to generate a reference signal in association with the modified magnitude of the signal to apply a magnitude approximate to a target magnitude (e.g., a target read voltage). To illustrate operation of reference cell 322, consider an example in which a read voltage magnitude, Vrd, is applied to word line 332 to read data from memory element 328b, and word lines 330 are unselected (e.g., word lines 330 are set to ground). In embodiments in which memory element 328b is a resistive state memory element, bit line 316n is configured to transmit a read current representative of a resistant state associated with a logic value stored in memory cell 324b. The read current 370 and the reference signal 360 are provided via bit line 316n and reference bit line 314, respectively, to sense amplifier 342, which, in turn, compares the read current to the reference signal to determine the logic value.

Note that bit line 316a in the above example is configured to place memory element 328a in an inactive state. In some instances, memory element 328a is a resistive state memory element. When unselected, memory element 328a can, in some applications, provide a conduction path for current, which produces a voltage drop. Similar voltage drops can exist between bit line 316n and an access signal generator 301 along word line 322, whereby the voltage drops associated with word line 322 can aggregate to produce a collective voltage drop or differential for which access signal generator 301 is configured to address by modifying the magnitude of the read voltage. In some embodiments, word line 332 (as well as word lines 330) can be referred to as a "gateless" word line (or a gateless array line) as memory cells 324a and 324b may omit gate-like mechanisms, such as a transistor gate or a MOS transistor, that otherwise operate as open circuits. In one embodiment, reference resistive memory element 320 is disposed in a portion of a cross-point array (e.g., in slice 312) that includes memory elements 328a and 328b, both of which can be resistive memory elements. In some embodiments, reference bit line 314 can be disposed in between equal quantities of bit lines between bit lines 316a and 316n (e.g., in the middle of slice 312). By forming reference bit line 314 in the middle of slice 312, reference memory elements can receive a read voltage magnitude that approximates an average of the actual read voltage magnitudes over word line 322 within slice 312. In particular, reference bit line 314 being disposed in the middle of slice 312 has an equivalent amount of voltage drops on either side of it and experiences half the number of voltage drops between points 380 and 382 that memory element 328b experiences. In alternate embodiments, multiple reference bit lines 314 can used (not shown), whereby the reference memory elements for each of the multiple bit lines 314 provide different reference signal magnitudes. For example, three reference bit lines 314 can each include a group of different reference memory elements. A first group of reference memory elements can be configured to generate a reference signal having a magnitude representative of a programmed state, whereas a second group can be configured to generate another reference signal having a magnitude representative of an erased state. Yet a third group of reference memory elements can be configured to generate a reference signal having a magnitude in a range of magnitudes defined by magnitudes representative of the erased state and the programmed state. Note that any number of reference bit lines 314 can be implemented in slice 312 at any location therein.

Figure 4:
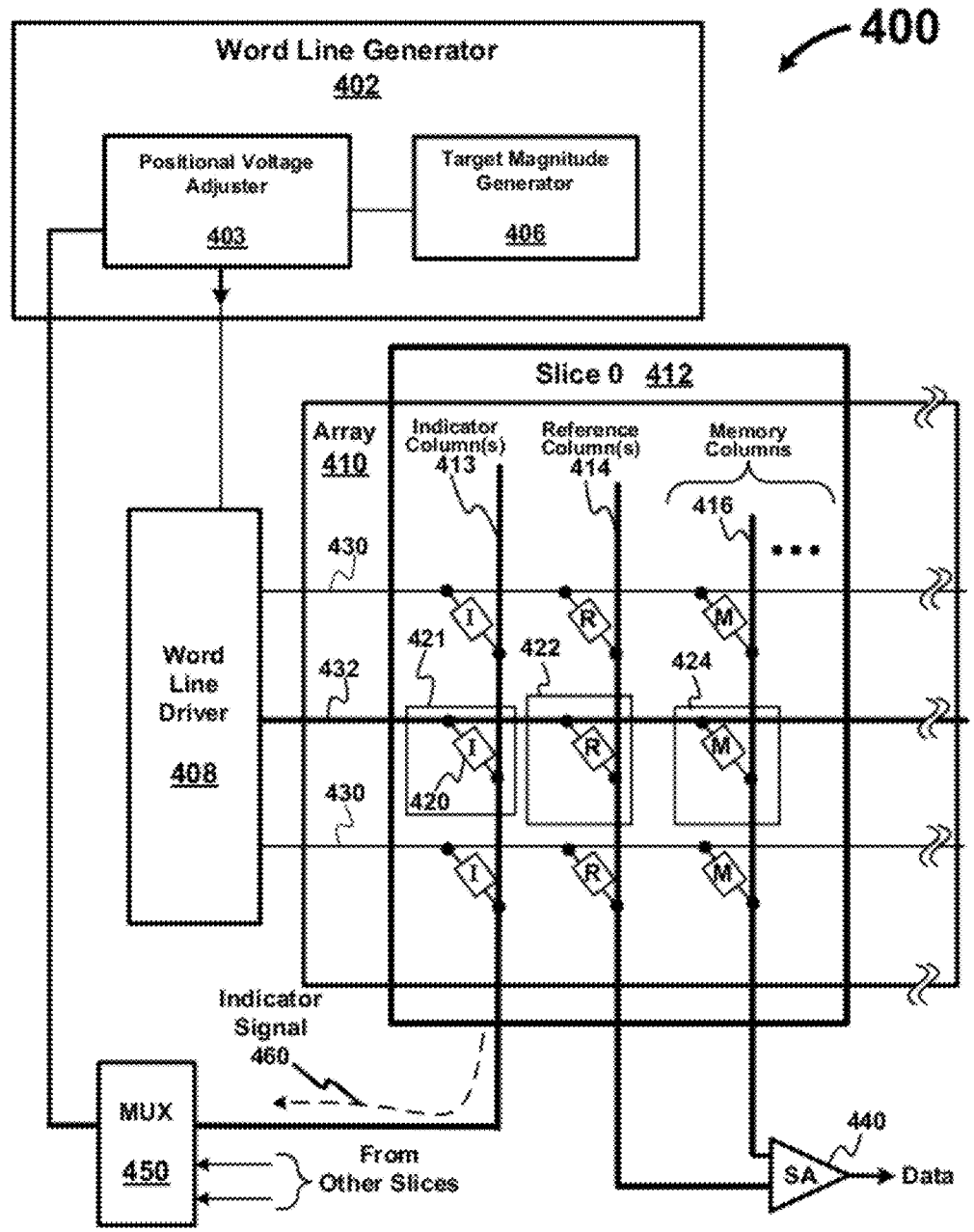
FIG. 4 depicts an example of a word line voltage generator configured to access an example of a slice, according to various embodiments of the invention.

FIG. 4 depicts an example of a word line voltage generator configured to access an example of a slice, according to various embodiments of the invention. Diagram 400 depicts a word line voltage generator 402 coupled via a word line driver 408 to an array 410 including any number of slices, such as slice ("0") 412. Also shown is a multiplexer ("MUX") 450 is coupled between slice 412 and word line voltage generator 402, and is configured to multiplex signals from slice 412 and from other slices not shown. In the example shown, slice 412 includes word lines 430 and 432 extending into array 410 from word line driver 408. Slice 412 also includes one or more bit lines configured as indicator columns 413, one or more bit lines configured as reference columns 414, and a number of bit lines configured as memory columns 416. Similar to reference bit lines 314 and bit lines 316 of FIG. 3, one or more reference columns 414 are configured to provide reference signals generated by reference memory elements ("R") 422, and memory columns 416 are each configured to provide read current signals generated by memory elements ("M") 424, the read current signals representing stored data. Sense amplifier ("SA") 440 is coupled to one or more reference columns 414 and memory columns 416 to generate a Data signal(s) representative of data read from memory elements 424. Further, diagram 400 depicts indicator memory cells 421 coupled between indicator column 413 and respective word lines 430 and 432.

Indicator column 413 is configured to provide for real-time (or near real-time) word line voltage sensing and to convey indicator signals 460 generated by indicator memory elements ("I") 420. As a word line tracking reference, the indicator signals are representative of a detected magnitude at one of word lines 430 and 432. The detected magnitude can be sampled at or near a position of memory element 424, which can be a resistance state memory element according to some embodiments. Also, the detected magnitude can represent a magnitude of voltage on word line 432, for example, at a distance from word line driver 408 in which voltage drops reduce an amount of a read voltage applied to word line 432. In some embodiments, indicator memory elements can be configured to be in an erased state.

Word line voltage generator 402 is configured to generate a modified magnitude for a read voltage signal responsive, at least in part, to indicator signal 460. The modified magnitude is configured to compensate for the voltage drops between word line driver 408 and a position along any of word lines 430 and 432. Word line voltage generator 402 can include a target magnitude generator 406 and a positional voltage adjuster 403. Target magnitude generator 406 can be configured to generate a target magnitude for the read voltage signal to be applied via word line 432 to memory cell 424. Positional voltage adjuster 403 is coupled to target voltage generator 406 to receive a read voltage signal having a magnitude equivalent or approximate to the target magnitude, and, as shown, positional voltage adjuster 403 can be coupled to MUX 450 to receive indicator signal 460. Positional voltage adjuster 403 operates to compare the detected magnitude derived from indictor signal 460 to the target magnitude produced by target magnitude generator 406. Positional voltage adjuster 403 further operates to determine a voltage error (i.e., a deviation from the target magnitude) and to adjust the magnitude of the read voltage to form a modified magnitude.

Figure 5:
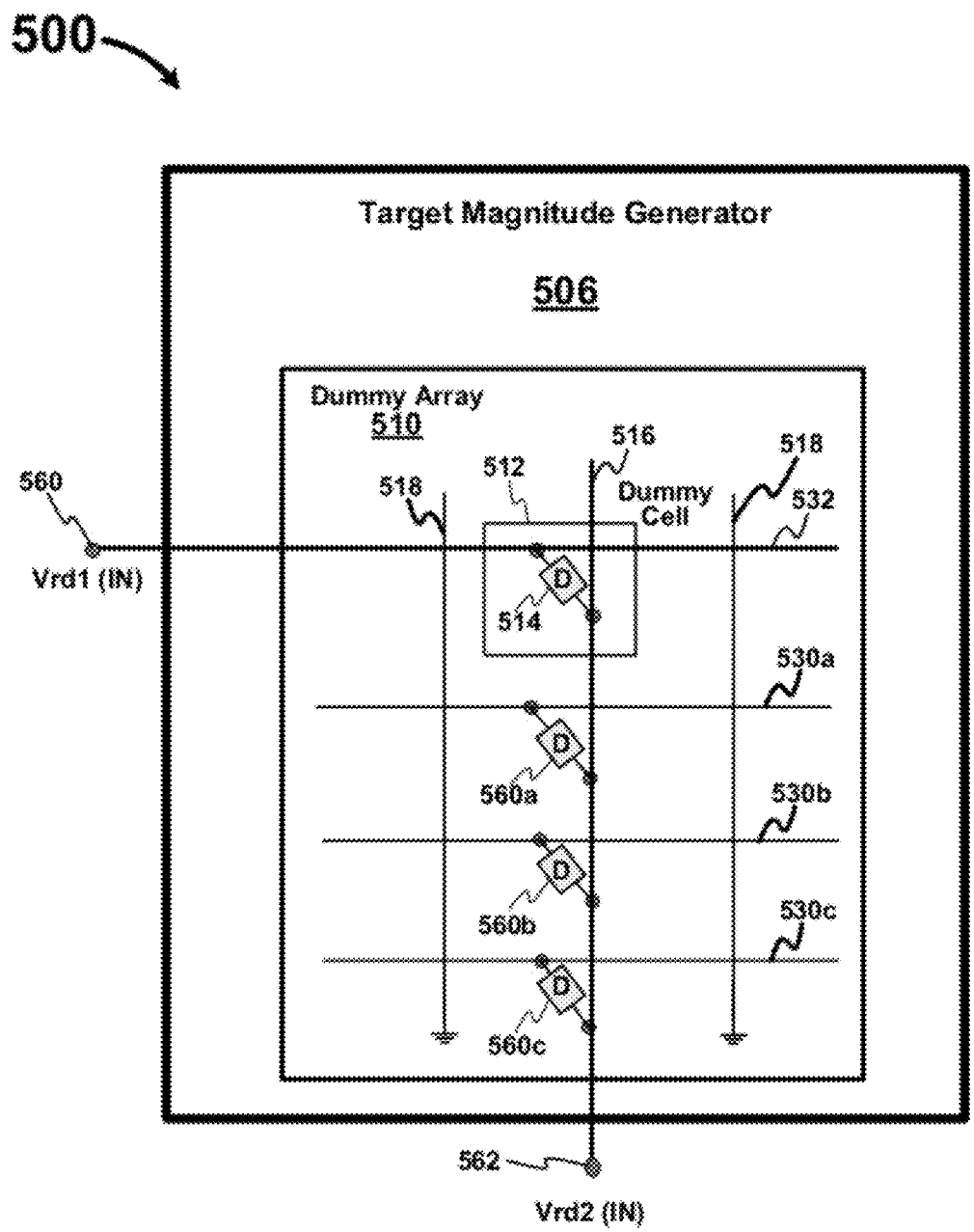
FIG. 5 depicts a diagram of a target magnitude generator, according to at least some embodiments of the invention.

FIG. 5 depicts a diagram of a target magnitude generator, according to at least some embodiments of the invention. In the example shown in diagram 500, target magnitude generator 506 includes a dummy array 510 configured to receive a voltage ("Vrd1 (IN)") at terminal 560 and to generate a read voltage ("Vrd2 (IN)") having a target magnitude at terminal 562. Dummy array 510 includes a dummy word line 532 coupled to terminal 560 and to a first terminal of a dummy cell 512, which includes a dummy memory element ("0") 514. Dummy array 510 also includes a number of word lines 530a, 530b, and 530c that can be grounded or otherwise set to a magnitude representative of an unselected state. For example, the magnitude representative of an unselected state can be a voltage level similar to those voltage levels applied to unselected memory cells in the array (e.g., array 110 of FIG. 1). Dummy array 510 further includes a number of bit lines 518 that can be grounded, and a dummy bit line 516 coupled to terminal 562 and a second terminal of memory element 514. Dummy array 510 is configured to condition the voltage applied to terminal 560 to generate a target read voltage magnitude at terminal 562. Note that dummy array 510 can be implemented to provide a target write voltage and/or a target erase voltage magnitude for other memory operations, according to some embodiments. In some cases, dummy array 510 can be configured to provide one or more target voltage magnitudes (e.g., one or more of a target read voltage magnitude, a target write voltage magnitude and a target erase voltage magnitude).

Note that in some instances, dummy array 510 can be formed external to either one or more slices or an array, such as a cross-point array. According to some embodiments, dummy memory element 514 is a dummy resistive state memory element configured to emulate operation of an indicator resistive memory element. In some embodiments, dummy memory element 514 can be configured to be in an erased state. Similarly, dummy bit line 516 can be configured to emulate operation of an indicator column disposed in a slice with an array. According to a specific embodiment, the voltage ("Vrd1 (IN)"), or variations thereof, can be applied to each of dummy word line 532, word line 530a, word line 530b, and word line 530c at different points in times. Optionally, each of dummy word line 532, word line 530a, word line 530b, and word line 530c can be used to access different slices or groups of bit lines in the array. For example, dummy element 514 can be used for one access line 116 of FIG. 1, and dummy element 560a (or dummy elements 560b or 560c) can be used to access memory cells, for example, in other access lines 116. In some instances, using different dummy elements 514, 560a, 560b, and 560c can experience less usage (e.g., operational stress) than if one of dummy elements 514, 560a, 560b, and 560c were used for multiple groups of slices. Note that while FIG. 5 depicts four (4) dummy elements, the various embodiments are not limited to any specific number of dummy elements, and, further, are not limited to any specific number of slices that each of dummy elements 514, 560a, 560b, and 560c can relate.

Figure 6:
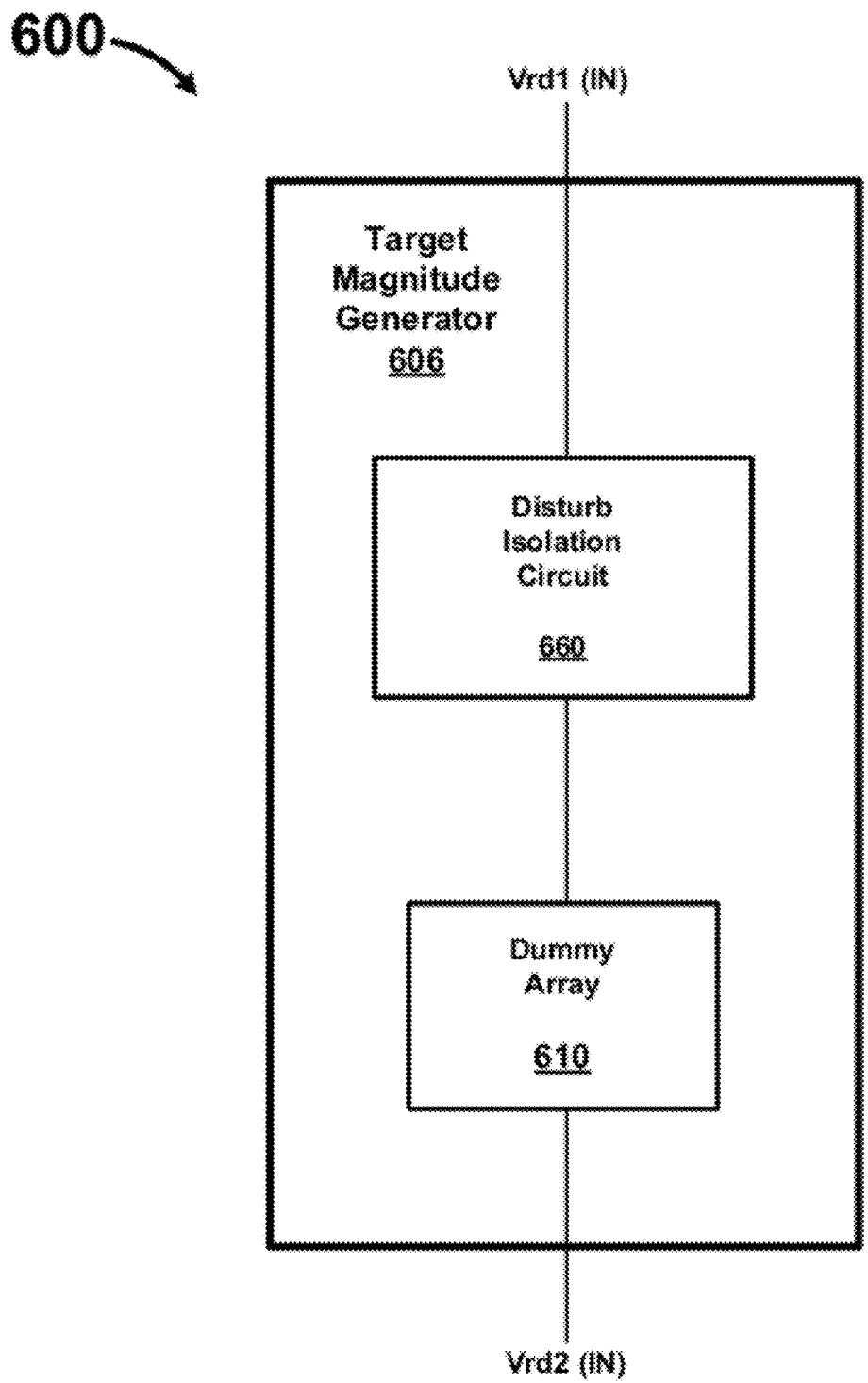
FIG. 6 depicts a diagram depicting another example of a target magnitude generator adapted to address disturb effects, according to some embodiments.

FIG. 6 depicts a diagram depicting another example of a target magnitude generator adapted to address disturb effects, according to some embodiments. Diagram 600 depicts a target magnitude generator 606 including a disturb isolation circuit 660 and a dummy array 610, which can have a structure and/or function similar to dummy array 510 of FIG. 5. Disturb isolation circuit 660 can be configured to isolate or reduce disturb effects or other similar phenomena, and can compensate for disturbances of the magnitude of a read voltage signal associated with a particular word line. An example of a disturb effect is caused by repeated applications of read voltages (e.g., a target read magnitude), whereby the disturb effect can affect data retention in unselected memory elements or can affect operation of a reference memory element. In one embodiment, disturb isolation circuit 660 is configured to reduce the target read magnitude and/or an amount of voltage swings on the word lines to reduce or negate disturb effects on, for example, unselected memory elements. In a specific embodiment, disturb isolation circuit 660 can be configured to reduce the magnitude of the read voltage signal while maintaining an access current equivalent to that associate with a first magnitude of the read voltage signal.

Figure 7:
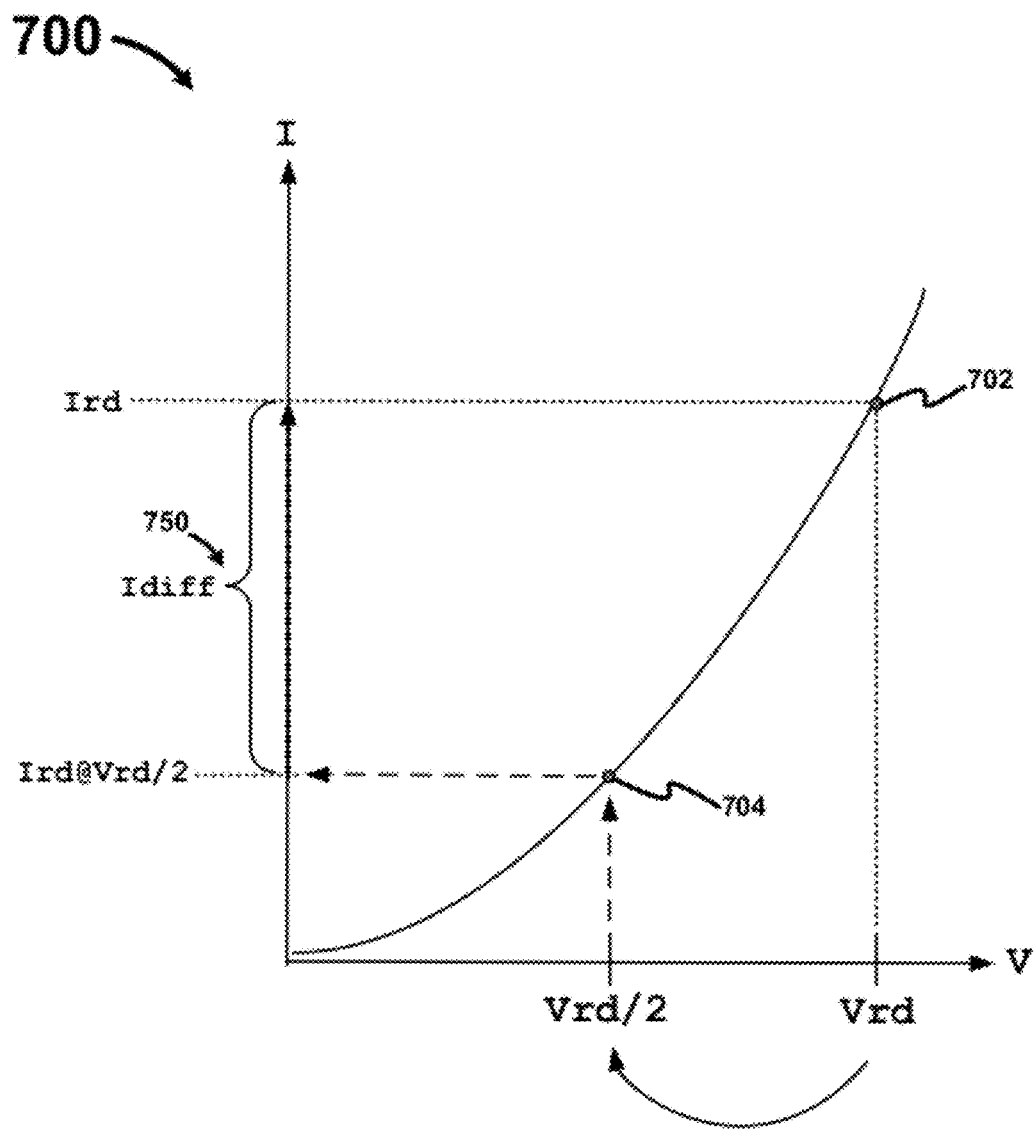
FIG. 7 depicts a diagram depicting how a disturb isolation circuit can operate to address disturb effects, according to some embodiments.

FIG. 7 depicts a diagram depicting how a disturb isolation circuit can operate to address disturb effects, according to some embodiments. Diagram 700 depicts a non-linear relationship to a read voltage applied to a memory element, such as a resistive state memory element, and a corresponding read current to access the memory element. As shown, a disturb isolation circuit can operate to reduce a target read voltage magnitude, Vrd, to approximate one-half the target read voltage magnitude, Vrd/2. The disturb isolation circuit can compensate for the reduction in read current when reducing a read current, Ird, from point 702 to a read current, Ird@Vrd/2, at point 704. Specifically, the disturb isolation circuit boosts the read current associated with point 704 by an amount ("Idiff") 750 to provide an amount of current, Ird, when the target read voltage magnitude is halved.

Figure 8:
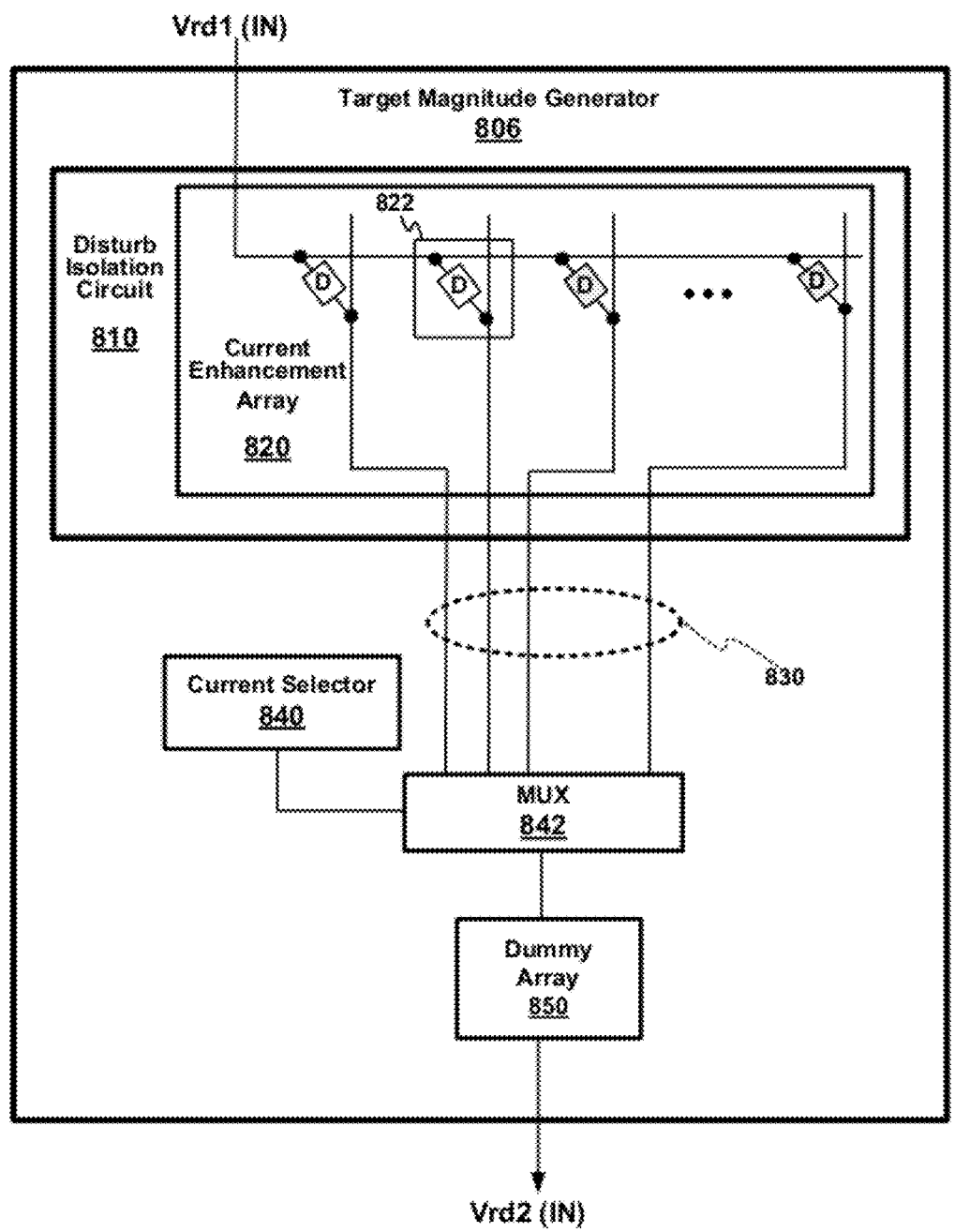
FIG. 8 depicts a diagram depicting a target magnitude generator with a specific implementation of a disturb isolation circuit, according to some embodiments.

FIG. 8 depicts a diagram depicting a target magnitude generator with a specific implementation of a disturb isolation circuit, according to some embodiments. Target magnitude generator 806 includes a disturb isolation circuit 810 composed of a current enhancement array 820. Further, target magnitude generator 806 can include a current selector 840, a multiplexer ("MUX") 842, and a dummy array 850. Current enhancement array 820 can include resistive memory elements that configured to generate an amount of current at a portion of the target magnitude of the signal (i.e., the portion represents a reduce target read voltage magnitude). The amount of current generated by current enhancement array 820 can be equivalent to a current generated by a resistive memory element with the target magnitude of the signal. Current enhancement array 820 can include a number of resistive memory elements coupled in parallel, the resistive memory elements being depicted as part of dummy cells ("0") 822.

Current selector 840 is configured to control MUX 842 to select a subset of bit lines 830 from which to receive read current amount from a particular number of resistive memory element that can generate an enhanced or boosted read current. In some embodiments, current selector 840 can generate an enhanced current to ensure that resistive-capacitance ("RC") characteristics (e.g., such as during current charging of a capacitive load) for a bit line are equivalent to that for a single dummy memory element generating a full target read voltage magnitude. Dummy array 850 can be configured for loading purposes to emulate operation of indicator memory elements and/or memory elements in a slice.

Figure 9:
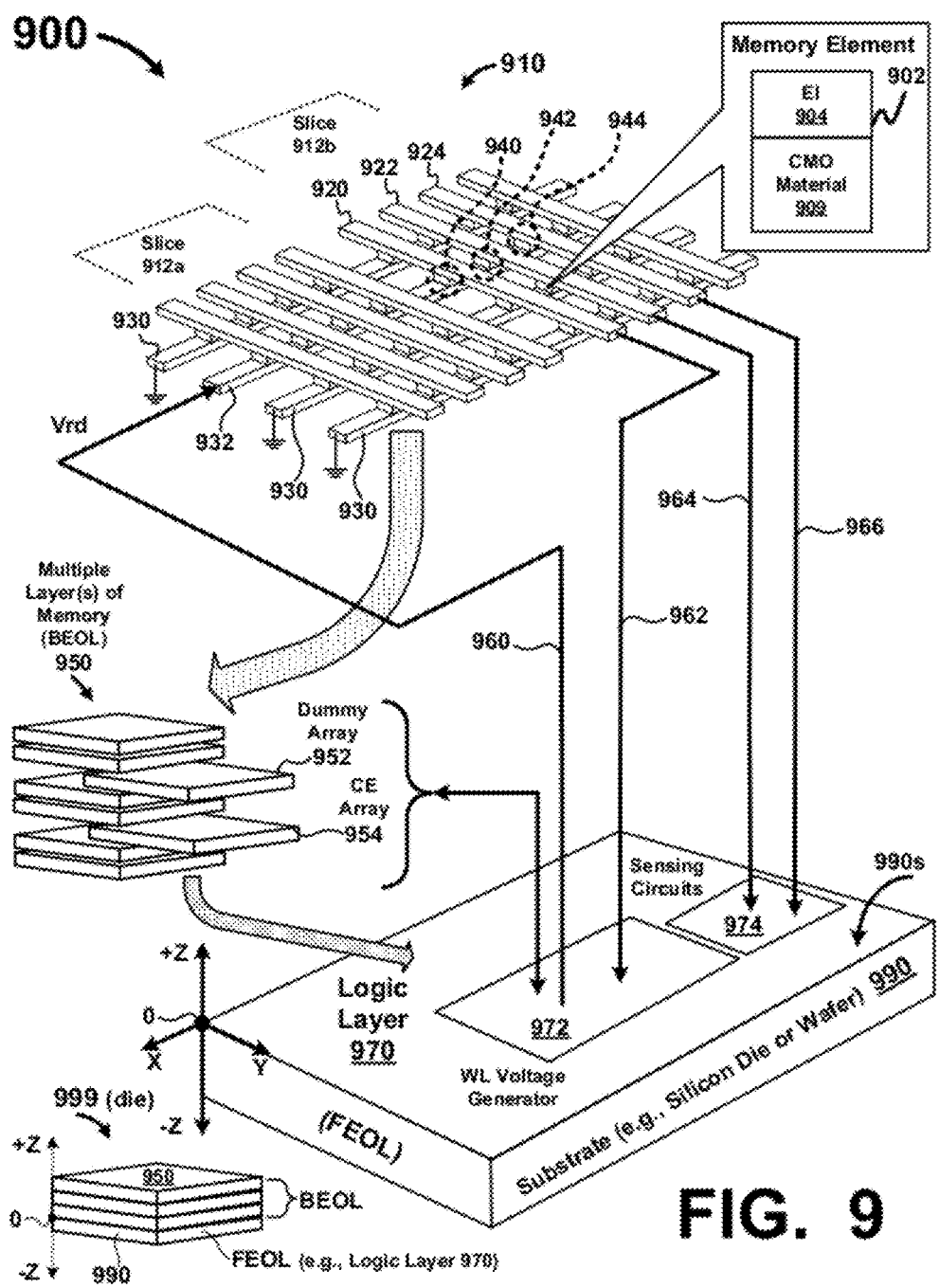
FIG. 9 depicts an example of a cross-point array including multiple layers of memory, according to various embodiments of the invention.

FIG. 9 depicts an example of a cross-point array of memory cells including multiple layers of memory, according to various embodiments of the invention. Although multiple layers of memory are depicted, the cross-point array can include only a single layer of memory. In this example, diagram 900 depicts a portion 910 of a cross-point array that forms one of multiple layers of memory 950, which are formed on or above a substrate 990 that includes a logic layer 970 having active circuitry operative to perform data operations on the one or more memory layers 950. The substrate 990 can be a silicon (Si) wafer upon which circuitry in the logic layer 970 (e.g., CMOS circuitry) is fabricated as part of a front-end-of-the-line (FEOL) fabrication process. An inter-layer interconnect structure (not shown) fabricated as part of the FEOL processing can include electrically conductive interconnect structures (e.g., vias, throughs, plugs, contacts, or the like) configured to electrically couple the circuitry in the logic layer 970 with one or more memory layers 950 that are fabricated directly on top of and in contact with the substrate 990. Subsequently, the one or more layers of memory 950 can be fabricated directly on top of an upper surface 990s (e.g., along the +Z axis) of the substrate 990 as part of a back-end-of-the-line (BEOL) fabrication process tailored for fabricating non-volatile two-terminal cross-point memory arrays. The upper surface 990s can be an upper surface of the aforementioned FEOL inter-layer interconnect structure. If multiple layers of BEOL memory 950 are fabricated, the multiple layers are vertically stacked upon one another along the +Z axis. After FEOL and BEOL processing are completed, the silicon wafer can be cingulated into individual silicon die 999, with each die 999 being an integrated circuit having a FEOL portion 990 with active circuitry 970 fabricated thereon and a BEOL memory portion 950 (e.g., three vertically stacked layers of memory) that are a unitary whole, that is, the BEOL portion is grown directly on top of the FEOL portion to form a single die 999 that can be mounted in a suitable package (not shown) for an IC and wire bonded or the like to electrically couple with pins on the package. As shown, portion 910 of the cross-point array includes conductive X-lines 930 and 932, and is partitioned into slices 912a and 912b, each including a subset of conductive Y-lines, including Y-lines 920, 922, and 924. In one embodiment, a slice includes at least one Y-line 920 that is configured as an indicator column and a number of Y-lines 924 that are configured as memory columns. In another embodiment, a slice includes at least one Y-line 922 that is configured as a reference column and a number of Y-lines 924 that are configured as memory columns. According to various embodiments, indicator columns and/or reference column are optional and need not be implemented in every slice. For example, indicator columns and/or reference column can be implemented in every "N" number of slices along conductive X-lines 930 and 932, where N can represent two or more. As such, reference signals and/or indicator signals can be generated for multiple slices. Note that while FIG. 9 depicts slices 912a and 912b being oriented in a layer of memory coincident with an X-Y plane, slices 912a and 912b are not limited to the X-Y plane and can be oriented in the Y-Z and X-Z planes, according to other embodiments. Further, each of slices 912a and 912b can include multiple sets of Y-lines 920, 922, and 924, with each set being disposed at different X-Y planes along the Z-axis relative to the logic layer 970.

Word line ("WL") voltage generator 972 is configured to receive an indicator signal via path 962 from an indicator memory element 940, and, in response, generate a read voltage signal having a modified magnitude, Vrd, for transmission via path 960 to word line 932. The read voltage signal is applied via X-line 932 to terminals of a reference memory element 942 and a memory element 944 for generating a reference signal on Y-line 922 and a read current signal on Y-line 924, respectively. The reference signal and the read current signal traverse path 964 and path 966, respectively, for delivery to sensing circuits 974. In some embodiments, a dummy array 952 and/or a current enhancement ("CE") array 954 include memory elements distributed in any layer within the multiple layers of memory 950. Note that while FIG. 9 depicts dummy array 952 and current enhancement ("CE") array 954 being disposed on different layers of memory, they need not be so limited. Thus, dummy array 952 and current enhancement array 954 (or portions thereof) can be disposed on the same layer of memory or can be distributed over multiple layers of memory. In at least one embodiment, dummy array 952 and current enhancement ("CE") array 954 are disposed in the same layer of memory as are the slices to which arrays 952 and 954 relate.

In some embodiments, a memory element describe in this figure or any figure herein can be implemented as a resistive memory element 902 that includes a structure 904 including an electrolytic insulator ("EI") disposed on a structure 909 including one or more layers of a conductive oxide material, such as a conductive metal oxide-based ("CMO-based") material, for example. Memory element 902 further includes two terminals (not shown). In various embodiments, CMO material 909 can include but is not limited to a material selected from one or more the following: $PrCaMnO_X$ (PCMO), $LaNiO_X$ (LNO), $SrRuO_X$ (SRO), $LaSrCrO_X$ (LSCrO), $LaCaMnO_X$ (LCMO), $LaSrCaMnO_X$ (LSCMO), $LaSrMnO_X$ (LSMO), $LaSrCoO_X$ (LSCoO), and $LaSrFeO_X$ (LSFeO), where x is nominally 3 for perovskites. In various embodiments, electrolytic insulator 904 can include but is not limited to a material for implementing a tunnel barrier layer, the material being selected from one or more of the following: rare earth oxides, rare earth metal oxides, yttria-stabilized zirconium (YSZ), zirconia ($ZrO_X$), yttrium oxide ($YO_X$), erbium oxide ($ErO_X$), gadolinium oxide ($GdO_X$), lanthanum aluminum oxide ($LaAlO_X$), and hafnium oxide ($HfO_X$), and equivalent materials. Typically, the electrolytic insulator 904 comprises a thin film layer having a thickness of approximately less than 50 Å (e.g., in a range from about 10 Å to about 35 Å).

The various embodiments of the invention can be implemented in numerous ways, including as a system, a process, an apparatus, or a series of program instructions on a computer readable medium such as a computer readable storage medium or a computer network where the program instructions are sent over optical or electronic communication links. In general, the steps of disclosed processes can be performed in an arbitrary order, unless otherwise provided in the claims.

The foregoing description, for purposes of explanation, uses specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

What is claimed is:

1. A non-volatile memory device, comprising:
   a two-terminal cross-point array including resistive memory elements (ME's), word lines, and subsets of bit lines, each ME having exactly two terminals and configured to retain stored data in an absence of electrical power, the ME's are disposed among the word lines and the subsets of bit lines, each ME is positioned between a cross-point of a unique pair of one of the word lines and one of the bit lines and is directly electrically in series with its unique pair; and
   an access signal generator configured to modify a magnitude of a signal to generate a modified magnitude for the signal to access a selected ME associated with a word line and a subset of bit lines, the modified magnitude being a function of a position of the selected ME in the cross-point array.

2. The non-volatile memory device as set forth in claim 1, wherein the access signal generator is configured to adjust the magnitude of the signal as a function of a distance between the position of the selected ME and the access signal generator.

3. The non-volatile memory device as set forth in claim 1, further comprising:
   another ME electrically coupled with the word line and with another bit line.

4. The non-volatile memory device as set forth in claim 3, wherein the access signal generator is configured to adjust the magnitude of the signal to compensate for a voltage drop associated with the another ME.

5. The non-volatile memory device as set forth in claim 1, wherein the access signal generator is configured to adjust the magnitude of the signal to compensate for a deviation in the magnitude from a target magnitude.

6. The non-volatile memory device as set forth in claim 5, wherein the access signal generator is configured to adjust a read voltage magnitude of the signal to form the modified magnitude to facilitate a read operation on the selected ME.

7. The non-volatile memory device as set forth in claim 5, wherein the access signal generator is configured to adjust a write voltage magnitude of the signal to form the modified magnitude to facilitate a write operation.

8. The non-volatile memory device as set forth in claim 5, wherein the access signal generator is configured to adjust an erase voltage magnitude of the signal to form the modified magnitude to facilitate an erase operation on the selected ME.

9. The non-volatile memory device as set forth in claim 5, wherein the access signal generator is configured to adjust a program voltage magnitude of the signal to form the modified magnitude to facilitate a program operation on the selected ME.

10. The non-volatile memory device as set forth in claim 1, wherein at least one of the subsets of the bit lines comprises
a reference bit line, and
reference resistive memory elements (RME's), each RME is electrically coupled with the reference bit line and one of the word lines, each RME having exactly two terminals,
wherein at least one RME is electrically coupled with the reference bit line and the word line to generate a reference signal based on the modified magnitude of the signal.

11. The non-volatile memory device as set forth in claim 10, wherein the at least one RME is disposed in a portion of the cross-point array that includes the selected ME.

12. The non-volatile memory device as set forth in claim 1, wherein at least one of the subsets of the bit lines comprises
an indicator bit line, and
indicator resistive memory elements (IME's), each IME is electrically coupled with the indicator bit line and one of the word lines, each IME having exactly two terminals,
wherein at least one IME is electrically coupled with the indicator bit line and the word line to generate an indicator signal representing a detected magnitude for the signal at or near the position of the selected ME.

13. The non-volatile memory device as set forth in claim 12, wherein the at least one IME is disposed in a portion of the cross-point array that includes the selected ME.

14. The non-volatile memory device as set forth in claim 12, wherein the access signal generator further comprises
a target magnitude generator configured to generate a target magnitude for the signal, and
a positional voltage adjuster electrically coupled with the target magnitude and electrically coupled with the indicator signal, the positional voltage adjuster configured to compare the detected magnitude to the target magnitude and to adjust the magnitude to form the modified magnitude.

15. The non-volatile memory device as set forth in claim 1 and further comprising:
an array disposed external to the subset of bit lines, the array including a dummy memory element (DME) configured to emulate operation of at least one indicator resistive memory element (IME).

16. The non-volatile memory device as set forth in claim 1 and further comprising:
a disturb isolator circuit configured to compensate for disturbances of the magnitude of the signal associated with the word line.

17. The non-volatile memory device as set forth in claim 16, wherein the disturb isolator circuit comprises a current enhancement array of ME's configured to generate an amount of current at a portion of the target magnitude of the signal, the amount of current being equivalent to a current generated by the ME with the target magnitude of the signal.

18. The non-volatile memory device as set forth in claim 16, wherein the disturb isolator circuit comprises a current enhancement array of ME's that are electrically coupled in parallel.

19. The non-volatile memory device as set forth in claim 1, further comprising:
a slice-rolling controller configured to generate the modified magnitude for transmission to the position and to another position,
wherein the position and the another position are substantially equidistant from the access signal generator.

20. The non-volatile memory device as set forth in claim 19, wherein the slice-rolling controller is configured further to increase the value of the modified magnitude as the distance increases between each of the position and the another position and the access signal generator.

21. The non-volatile memory device as set forth in claim 1, wherein the modified magnitude comprises a voltage magnitude selected from the group consisting of a programming voltage magnitude, an erase voltage magnitude, a write voltage magnitude, and a read voltage magnitude.

22. The non-volatile memory device as set forth in claim 1, wherein at least one of the subsets of the bit lines comprises
an indicator bit line, and
indicator resistive memory elements (IME's), each IME is electrically coupled with the indicator bit line and one of the word lines,
wherein at least one IME is electrically coupled between the indicator bit line and the word line to generate an indicator signal representing a detected magnitude for the signal at or near the position of the selected ME.

23. The non-volatile memory device as set forth in claim 1, wherein each ME includes an ion reservoir having mobile oxygen ions and a tunnel barrier that are electrically in series with each other and with the two terminals of the ME.

24. The non-volatile memory device as set forth in claim 23, wherein each ME includes a non-linear I-V relationship between a voltage applied across its two terminals and a current flow through the ME while the voltage is applied.

25. The non-volatile memory device as set forth in claim 1 and further comprising:
a semiconductor substrate including a logic layer fabricated front-end-of-the-line (FEOL) on the semiconductor substrate, the logic layer including active circuitry, and the active circuitry including the access signal generator; and
a memory layer fabricated back-end-of-the-line (BEOL) directly above and in contact with the semiconductor substrate, the memory layer including the two-terminal cross-point array.

26. The non-volatile memory device as set forth in claim 25, wherein the semiconductor substrate comprises a silicon wafer, a silicon die, or a cingulated silicon die.

27. The non-volatile memory device as set forth in claim 1, wherein each ME includes a non-linear I-V relationship between a voltage applied across its two terminals and a current flow through the ME while the voltage is applied.

28. The non-volatile memory device as set forth in claim 1, wherein the word lines and subsets of bit lines are positioned in a slice.

* * * * *